US006417659B1

(12) United States Patent
Schroeder

(10) Patent No.: US 6,417,659 B1
(45) Date of Patent: Jul. 9, 2002

(54) ELECTRONIC CIRCUIT FOR TUNING VIBRATORY TRANSDUCERS

(75) Inventor: Gary Schroeder, Kansas City, MO (US)

(73) Assignee: Systems Material Handling Co., Olathe, KS (US)

( * ) Notice: Subject to any disclaimer, the term of this patent is extended or adjusted under 35 U.S.C. 154(b) by 24 days.

(21) Appl. No.: 09/639,048

(22) Filed: Aug. 15, 2000

(51) Int. Cl.[7] ........................... G01R 23/08; H04R 3/00
(52) U.S. Cl. ....................................... 324/76.51; 381/96
(58) Field of Search .............................. 324/76.49, 727, 324/76.51; 381/96

(56) References Cited

U.S. PATENT DOCUMENTS

| | | | |
|---|---|---|---|
| 3,742,492 | A | 6/1973 | Proctor |
| 3,967,143 | A | 6/1976 | Watanabe et al. |
| 4,195,284 | A | 3/1980 | Hampshire et al. |
| 4,393,373 | A | 7/1983 | Tori et al. |
| 5,109,212 | A | 4/1992 | Cortinovis et al. |
| 5,181,019 | A | 1/1993 | Gottlieb et al. |
| 5,414,406 | A | 5/1995 | Baxter |
| 5,596,311 | A | 1/1997 | Bess et al. |

*Primary Examiner*—N. Le
*Assistant Examiner*—James Kerveros
(74) *Attorney, Agent, or Firm*—Hovey Williams LLP

(57) ABSTRACT

A method and self-tuning circuit for tuning vibratory transducers, broadly including electroacoustic speakers and specifically including the speakers of common back-up alarms used for safety reasons on commercial vehicles and heavy equipment. The self-tuning circuit is physically coupled to the transducer's input terminals and operates by comparing the rising and falling edges of one period of a test waveform elicited from the transducer by the application of a test signal having a test frequency. Depending on the results of this comparison, the test frequency is adjusted by predetermined increments upward or downward until the transducer's resonance frequency has been tightly bracketed though not exactly pinpointed.

14 Claims, 3 Drawing Sheets

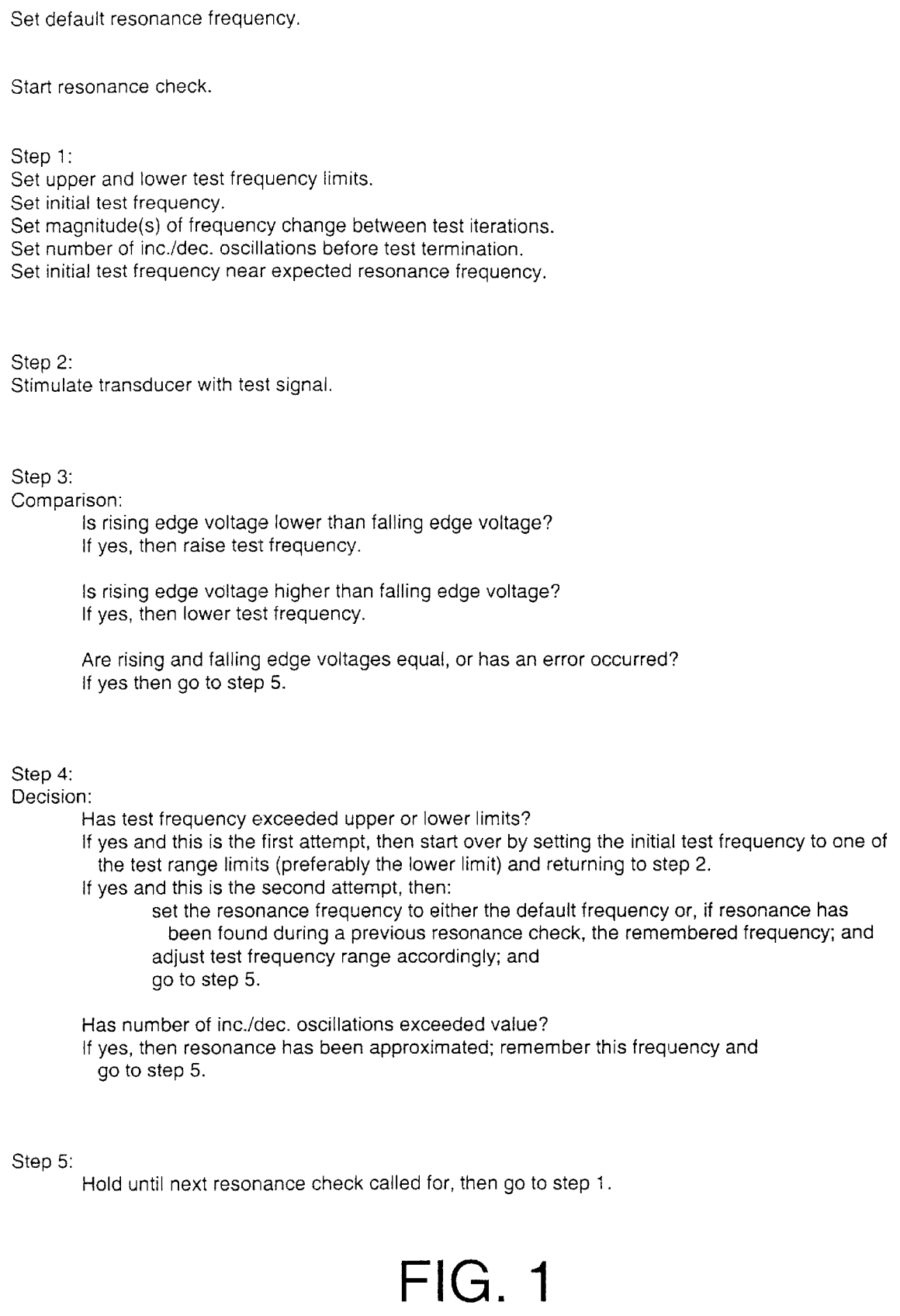

Set default resonance frequency.

Start resonance check.

Step 1:
Set upper and lower test frequency limits.
Set initial test frequency.
Set magnitude(s) of frequency change between test iterations.
Set number of inc./dec. oscillations before test termination.
Set initial test frequency near expected resonance frequency.

Step 2:
Stimulate transducer with test signal.

Step 3:
Comparison:

Is rising edge voltage lower than falling edge voltage?
If yes, then raise test frequency.

Is rising edge voltage higher than falling edge voltage?
If yes, then lower test frequency.

Are rising and falling edge voltages equal, or has an error occurred?
If yes then go to step 5.

Step 4:
Decision:

Has test frequency exceeded upper or lower limits?
If yes and this is the first attempt, then start over by setting the initial test frequency to one of the test range limits (preferably the lower limit) and returning to step 2.
If yes and this is the second attempt, then:

set the resonance frequency to either the default frequency or, if resonance has been found during a previous resonance check, the remembered frequency; and
adjust test frequency range accordingly; and
go to step 5.

Has number of inc./dec. oscillations exceeded value?
If yes, then resonance has been approximated; remember this frequency and go to step 5.

Step 5:

Hold until next resonance check called for, then go to step 1.

FIG. 1

ELECTRONIC CIRCUIT FOR TUNING VIBRATORY TRANSDUCERS

BACKGROUND OF THE INVENTION

1. Field of the Invention

The present invention relates to the tuning of vibratory transducers, and, more particularly, to the tuning of speakers, including the speakers used in back-up alarms typically found on commercial vehicles and mobile equipment.

2. Description of the Prior Art

Vibratory transducers are devices that convert electric energy to kinetic energy. The resultant motion may by employed for a variety of purposes, including sound generation. This energy conversion is most efficient when the transducer is operating at its resonance frequency. Each vibratory transducer has its own particular resonance frequency to which it must be tuned for peak efficiency and maximum performance.

Vibratory transducers may be found, for example, in the speakers of back-up alarms which are coupled to commercial vehicles and other mobile equipment to warn passersby that the vehicle is operating in reverse. When activated, the back-up alarm generates a warning tone at a particular frequency. As described above, this frequency is preferably the resonance frequency of the transducer, thereby allowing the alarm's speaker to produce the loudest possible volume for a given energy input.

Vibratory transducers may be tuned during manufacture by, for example, placing a potentiometer within the speaker circuit and adjusting the potentiometer until the resonance frequency is reached. After initial tuning, the potentiometer is sometimes sealed to prevent accidental or undesirable adjustments away from the resonance frequency. Unfortunately, a transducer's resonance frequency will change with age and conditions of operation, including temperature and humidity. Thus, it is desirable to regularly re-tune a transducer. Even were the tuning mechanism not sealed, however, manual tuning is a time-consuming and inefficient process. More desirably, the transducer would re-tune itself. Various methods and apparatuses have been set forth which accomplish self-tuning. One common method involves comparing the phase of an input signal to the phase of the corresponding output signal, with zero phase difference indicating resonance. Other methods involve equating resonance with peak velocity or maximum displacement or vibration. These methods are generally suited to particular transducer applications or operating conditions, can require substantial additional hardware, and may yield results of questionable accuracy. Furthermore, many such methods require an intermediate input device, such as a microphone, for driving the speaker, which adds complexity, mass, and expense.

SUMMARY OF THE INVENTION

The method and apparatus of the present invention allow vibratory transducers, particularly speakers, including the speakers associated with back-up alarms, to frequently and regularly re-tune themselves to their resonance frequency. Broadly, the method and apparatus of the present invention operate by comparing the rising and falling edges of a test voltage waveform produced by the stimulated transducer.

More specifically, if the rising edge of a pulse of the voltage waveform is lower than the falling edge of the pulse, then the transducer is operating below its resonance frequency. If the rising edge of the voltage pulse is higher than the falling edge, then the transducer is operating above its resonance frequency. The closer the voltages are to being equivalent, the closer the transducer is to its resonance frequency. If the transducer is operating either above or below resonance, a simple electronic circuit in accordance with the present invention adjusts the operating frequency accordingly to more closely approach the resonance frequency.

By physically incorporating the simple electronic circuitry of the present invention into existing driver circuitry, the transducer is directly stimulated and tested without the need for microphones or other intermediate input devices commonly required by other methods and apparatuses. Thus, a vibratory transducer may be checked for resonance, and adjusted if needed, automatically, efficiently, without human intervention, and at frequent and regular intervals.

These and other important aspects of the present invention are more fully described in the section entitled DETAILED DESCRIPTION OF A PREFERRED EMBODIMENT, below.

BRIEF DESCRIPTION OF THE DRAWINGS

A preferred embodiment of the present invention is described in detail below with reference to the attached drawing figures, wherein:

FIG. 1 is a flowchart illustrating the steps in a preferred embodiment of the method of the present invention.

DETAILED DESCRIPTION OF A PREFERRED EMBODIMENT

1. The Method

Figure 2:
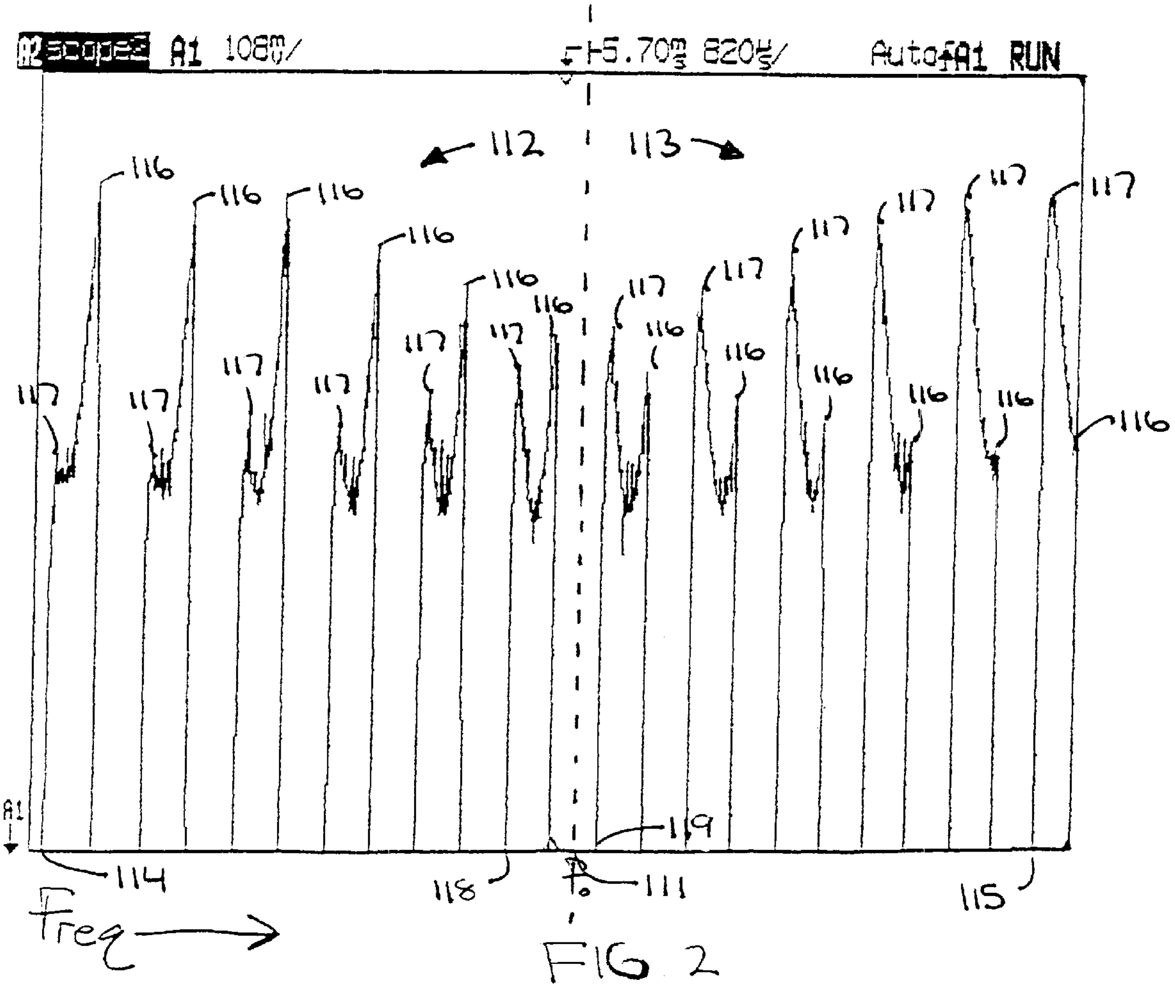
FIG. 2 is a waveform progression illustrating the relationship between resonance frequency and the rising and falling edge voltages of test waveforms.

Referring to FIG. 1, a flowchart is shown which illustrates a method of finding and maintaining the resonance frequency of a vibratory transducer. Such a method has application in maintaining peak efficiency and maximum performance in any vibratory transducer having the required waveform, including the speakers of common back-up alarms used on commercial vehicles and other mobile equipment.

The method of the present invention involves a process of successive approximation. Multiple test iterations are needed to accurately estimate the resonance frequency. Each successive test iteration results in a closer approximation until the resonance frequency has been tightly bracketed to a pre-determined degree of accuracy. FIG. 1 illustrates the steps involved in performing a single test iteration, a series of which constitute a single resonance check. A resonance check may be initiated as often and as regularly as is desirable and practical. The particular order of certain steps is not critical and may be altered without departing from the scope of the present invention.

Before beginning, a default resonance frequency should be set. This frequency will be used in the unlikely event that the method described below never finds the transducer's actual resonance frequency.

The first step 101 is to set both an initial test frequency and upper and lower limits to the range of test frequencies. Preferably, the initial test frequency will be near the middle of the test frequency range and based upon the typical resonance frequency for the type of transducer being tested. That is, the initial test frequency should be near the expected resonance frequency.

As described below, each resonance check preferably includes up to two attempts to find resonance. If the first attempt fails, using an initial test frequency that is near the expected resonance frequency, then a second attempt is made using either the upper or lower (preferably lower) test range limit as the initial test frequency.

The first step 101 also includes establishing the magnitude of the change in test frequency between successive test iterations. A smaller magnitude change will yield a more accurate result but will require that a greater number of frequencies be tested than if a larger magnitude change is used. Preferably, the system will employ frequency changes of varying magnitudes. Jumps in frequency should be relatively large until resonance has been passed-over once; this yields a very coarse approximation of the resonance frequency. Subsequent frequency changes should be smaller as the system refines its initial approximation. This method strikes a balance between speed, associated with large changes in frequency, and accuracy, associated with smaller changes.

Once the resonance frequency has been bracketed to the established degree of accuracy, the system will proceed to oscillate between increasing and decreasing the test frequency from one side of resonance to the other. A limit should be set on the number of such oscillations to be performed. It may be preferable, depending on the application and hardware used, to allow for more than one oscillation.

The second step 102 is to stimulate the speaker or other vibratory transducer with the test signal in order to produce a test waveform for analysis. Preferably, this is accomplished by directly stimulating the speaker itself without the use of any intermediate input device, such as a microphone.

The third step 103 is to examine a period of the test waveform by comparing its rising edge voltage to its falling edge voltage, and, based upon the comparison result, adjusting the test frequency to be used in the next test iteration. If the transducer is operating below its resonance frequency 104, then the rising edge will be at a lower voltage than the falling edge. In this case, the test frequency must be increased for the next test iteration. If the transducer is operating above its resonance frequency 105, then the rising edge will be at a higher voltage than the falling edge. In this case, the test frequency must be decreased for the next test iteration.

The effect of the third step 103 on the output waveform of a transducer under test is loosely illustrated in FIG. 2, wherein the resonance frequency 111 is located near the center of the illustration, and frequencies below 112 and above 113 resonance are located to the left and right, respectively, of the resonance frequency 111. Within limits, the greater the difference between the tested frequency and the resonance frequency 111 (as shown in FIG. 2, the frequencies progressively farther left 114 or right 115 of center), the greater the difference will be between the rising 116 and falling 117 edge voltages of a pulse of the waveform. Thus, as the tested frequency is increased or decreased in successive test iterations to more closely approximate the resonance frequency 111, the difference between the rising 116 and falling 117 edge voltages decreases until, at just above 118 or below 119 resonance, the rising 116 and falling 117 edge voltages are approximately equal.

Referring again to FIG. 1, the third step 103 also addresses the case where either the rising and falling voltages are equal or an error has occurred. Pinpointing the resonance frequency is unlikely and, in fact, the method of the present invention is not meant to find the exact resonance frequency. However, if by luck the resonance frequency is pinpointed, then the current series of test iterations ends with the fifth step 105.

Whether resonance can ever be pinpointed depends on the method or device used to compare the rising and falling edge voltages. Certain comparators, for example, are limited to one of two possible results—higher or lower—even though the edge voltages are exactly equal. Therefore, in order to pinpoint resonance, the system must be capable of recognizing equal rising and falling edge voltages.

Assuming that an error has not occurred and the exact resonance frequency has not been pinpointed, the fourth step 104 is to determine whether either the minimum or the maximum test frequency will be exceeded or whether the test frequency will approach the resonance frequency so closely that successive test iterations merely oscillate between increasing and decreasing the test frequency. This latter occurrence results in an estimation of the resonance frequency as a bracketed region between two known frequencies. The accuracy of this estimate (i.e., the size of the bracketed region), as discussed above, will depend upon the magnitude of the change in test frequency between tests. The number of test iterations following the first bracketing oscillation will be limited to a predetermined number after which the current test iteration will end with the fifth step 105.

If the first attempt to find resonance, using an initial test frequency based on the expected location of resonance, is unsuccessful, a second attempt is initiated. The second attempt will use as its initial test frequency one of the test range limits, preferably the lower limit. If the lower limit is used, then successive test iterations will employ progressively increasing test frequencies until either resonance is found or the upper limit is reached. It is also possible that the initial test frequency be the upper limit, in which case successive test iterations will employ progressively decreasing test frequencies until either resonance is found or the lower limit is reached.

If, after the second attempt, resonance has not been found, then the last known resonance frequency is used. Until a resonance frequency is found, a pre-loaded default frequency is used.

In the fifth and final step 105 the resonance check ends and the process is put on hold until another resonance check is called for. This will occur at some point whether the resonance check was successful in finding resonance or not. If the fifth step 105 occurs because the minimum or maximum test frequencies have been exceeded, then the range of frequencies tested by the next resonance check should be expanded accordingly.

This process may be repeated as often and with as much regularity as is practical and desirable in order to maintain the speaker or other vibratory transducer operating at its resonance frequency. It may be desirable between resonance checks to apply negative feedback to the transducer under test in order to control its output.

2. The Electronic Self-Tuning Circuit 10

Figure 3:
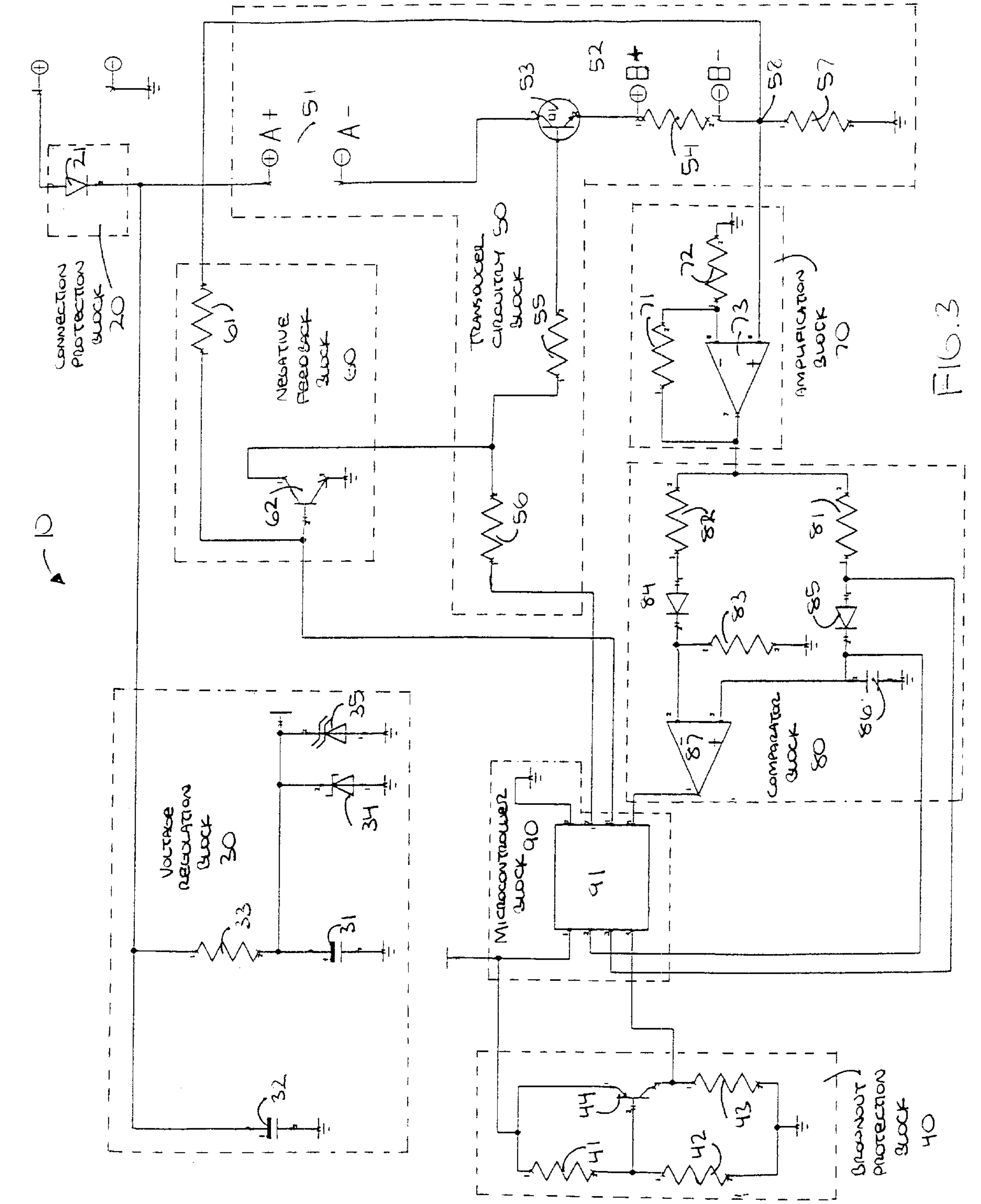
FIG. 3 is a block diagram superimposed over a detailed circuit schematic illustrating a tuning circuit constructed in accordance with a preferred embodiment of the present invention.

Referring to FIG. 3, a self-tuning circuit 10 is shown which may be used to implement the above described method and which is therefore useful for finding and maintaining the resonance frequency of any vibratory transducer that exhibits the required waveform. The self-tuning circuit 10 comprises eight major function blocks: a connection protection block 20; a voltage regulation block 30; a brownout protection block 40; a transducer circuitry block 50; a negative feedback block 60; an amplification block 70; a comparator block 80; and a microcontroller block 90. Such a self-tuning circuit 10.

The connection protection block 20 connects the circuit 10 to a power source and provides circuit protection in the event the transducer is reverse-connected to the power source. A preferred embodiment of the connection protection block 20 is shown comprising a diode 21 which functions to prevent a reverse flow of current through the circuit 10.

The voltage regulation block 30 provides regulation of circuit voltage levels generally, and, more particularly, protection against both high voltage spikes and low voltage brownouts. The voltage regulation block 30 is well-known in the art. A preferred embodiment of the voltage regulation block 30 is shown comprising: first and second capacitors 31,32; a resistor 33; a zener diode 34; and a transient voltage suppressor 35. The first and second capacitors 31,32 shunt high voltage spikes and act as voltage reservoirs in the event of a voltage brownout. The resistor 33 serves a current limiting function. The zener diode 34 regulates circuit voltage at 6.8 Volts. The transient voltage suppressor 35 behaves as a short circuit in the event of a voltage spike, thereby safely dissipating the voltage spike to ground.

The brownout protection block 40 provides voltage brownout, or low voltage, protection for the microcontroller block 90, described below. The brownout protection block 40 is well-known in the art. A preferred embodiment of the brownout protection block 40 is shown comprising: first, second, and third resistors 41,42,43; and a bipolar junction transistor 44. The first and second resistors 41,42 combine to provide a common voltage divider network.

In the event that the voltage power supply becomes too low, the base-emitter junction of the bipolar junction transistor 44 will cease being forward biased thereby causing current to stop flowing through the third resistor 43. This will, in turn, cause the microcontroller block 90, described below, to go to ground and reset itself.

The transducer circuitry block 50 provides a connection for interfacing a vibratory transducer with the circuit 10 of the present invention. A preferred embodiment of the transducer circuitry block 50 is shown comprising: first and second connection points 51,52; a power transistor 53; first, second, third, and fourth resistors 54,55,56,57. A transducer connected to the first connection point 51 will sound louder than the same transducer connected to the second connection point 52. The appropriate connection point for a given transducer depends on the transducer's decibel output and power rating. When coupled to the first connection point 51, the characteristic waveform voltage (peak-to-peak) measured at a certain point 58 in the circuit 10 increases as the power source voltage increases. If the power source voltage becomes too great, the ability of the amplifier block 70 to process the waveform will be exceeded. When connected to the second connection point 52, however, this problem does not arise.

The power transistor 53 is driven by the test signal produced by the microcontroller block 90. The power transistor 53 effectively behaves as an on-off switch that controls current flowing from the power source through the transducer.

The first resistor 54 is a jumper connection operable to connect the terminals not occupied by the transducer. The second and third resistors 55,56 are necessary for the proper operation of the respectively attached transistors 53,62. The fourth resistor 57 is a current limiting resistor, and the loudness of a connected transducer will vary inversely with the resistive value of the fourth resistor 57.

The negative feedback block 60 provides negative feedback which prevents a connected transducer from increasing in loudness as the power source voltage increases. In order to prevent distortion of the characteristic waveform during the tuning process, no negative feedback is applied until the resonance frequency is found, which may take approximately 0.006 seconds. The preferred negative feedback loop 60 comprises a resistor 61 and a transistor 62. The transistor 62 is a bipolar junction transistor.

The operational amplifier block 70 functions to buffer and amplify the characteristic waveform before it is introduced into the comparator block 80. The operational amplifier block 70 comprises a first resistor 71; a second resistor 72; and an operational amplifier 73. The first and second resistors 71,72 combine with the operational amplifier 73 to determine the gain characteristic of the operational amplifier block 70.

The comparator block 80 compares the rising and falling edges of the amplified waveform which was originally taken from a certain point 58 in the circuit 10. The comparator block 80 comprises first, second, and third resistors 81,82, 83; first and second diodes 84,85; a capacitor 86; and a comparator 87. The second and third resistors 82,83 form a common voltage divider which is used to adjust the voltage at the comparator 87. The capacitor 86 is used to capture a "snapshot" of the test voltage. The comparator 87 functions to assign either a 0 or a 1 value to the relationship between the rising and rising edges of the test waveform. It is this assigned value which determines the response of the microcontroller block 90.

The microcontroller block 90 comprises a microcontroller 91 which generates the test waveform and determines, based upon the results output by the comparator block 80, the proper test frequency. The microcontroller 91 includes computer code which can be found at the end of the section entitled DETAILED DESCRIPTION OF THE PREFERRED EMBODIMENT and before the section entitled CLAIMS. The computer code comprises six major subroutines, including: START; BEEP; PITCH, MAKEWAVE, ADJUST, MARKTIME, TOOHIGH, and TOOLOW. Furthermore, the computer code defines and makes use of seven flags, or indicators, which mark the circuit's progress toward determining the resonance frequency.

The following variables are referred to in the written description and in the computer program code which appears at the end of the written description:

| | |
|---|---|
| COMPAR | file register; stores comparator value; |
| RESCOPY | file register; stores last found resonance frequency; |
| FLAG | file register; stores tuning and checking flags |

-continued

| | |
|---|---|
| Flag 0 | if 1 then alarm tone oscillation comparison is complete; |
| Flag 1 | if 1 then first alarm tone is complete; |
| Flag 2 | if 1 then first attempt to find resonance was unsuccessful and second attempt has begun; |
| Flag 3 | if 1 then increase frequency; |
| Flag 4 | if 1 then decrease frequency; |
| Flag 6 | if 1 then go to MARKTIME subroutine; |
| Flag 7 | if 1 then FREETUNE is complete. |
| CF | literal; sets capacitor charging time; |
| MINVALUE | literal; stores minimum test frequency value; |
| MAXVALUE | literal; stores maximum test frequency value; |
| FREETUNE | file register; controls number of wave cycles for free-tuning; |
| FREESTART | literal; controls number of cycles to tune freely; |
| FREEAGAIN | literal; controls free-tuning cycles after failure; |
| OLDVAL | file register; stores last CALVAL; |
| LASTMATCH | file register; stores last CALVAL match. |

The START subroutine calibrates the internal oscillator to 4 MHz, sets CALVAL to an initial test frequency, sets MINVAL to a lower test frequency limit and MAXVAL to an upper test frequency limit, sets RESCOPY to a default frequency in the event resonance is not found, and clears all Flags.

The BEEP subroutine performs two major operations. First, it sets FREESTART to the number of iterations the transducer will be allowed to tune freely in order to accommodate sluggish reaction times of the comparator 87. By allowing the transducer to tune freely, without referring to the progress flags, resonance can be located more accurately. Second, BEEP determines how many times PITCH will be called.

Each call to the PITCH subroutine generates one test signal to stimulate the transducer being tested. If Flag 6=1 then resonance has been found and the program code will jump to the MARKTIME subroutine wherein negative feedback is maintained. If Flag 6=0, then PITCH calls MAKEWAVE wherein the rising and falling edges of the test waveform are captured and compared. Based on the results of the comparison carried out by the MAKEWAVE subroutine, the ADJUST subroutine adjusts the test frequency for the next test iteration.

If Flag 6=0 then the tuning process is still in progress. In the MAKEWAVE subroutine, the capacitor 86 will "record" the voltage of the waveform's rising edge. This voltage is captured, microseconds later, in a "snapshot". At the same time, the comparator 87 is comparing the rising and falling edge voltages. The result of this comparison is stored in COMPAR. If COMPAR=0, then the rising edge voltage is lower than that of the falling edge. If COMPAR=1, then the rising voltage is higher than that of the falling edge.

If the resonance frequency has been bracketed, Flag 7 allows a number of test iterations to pass before resonance is marked with Flag 3 (below resonance) and Flag 4 (above resonance). The FREETUNE register is used to keep track of the test iterations completed before resonance is marked. Flag 7 is set when FREETUNE is finished.

In the ADJUST subroutine, the value in the COMPAR register is read to determine whether the frequency should be raised (COMPAR=0), in which case CALVAL is decremented, or lowered (COMPAR=1), in which case CALVAL is incremented. This may be done without setting Flags 3 and 4, depending on whether Flag 7 has been set or not. There is a limit to how far CALVAL can be incremented or decremented, translating into a frequency range within which resonance should be found. Every time CALVAL is changed, it is checked against MINVAL or MAXVAL to determine whether it has exceeded the established test frequency range. If so, ADJUST calls either the TOOHI or TOOLOW subroutines, whichever is appropriate. The circuit 10 will then be given one more opportunity to find the resonance frequency. Flag 2 keeps track of this. Appropriate Flags are reset and the largest allowed value is loaded into CALVAL because the circuit 10 finds resonance easiest when it starts below resonance and sweeps upward to it.

If the circuit 10 fails to find resonance on this last attempt, the last found resonance frequency is loaded into the CALVAL register from RESCOPY. Every time resonance is found, a copy of that frequency value is loaded into RESCOPY for use in the event that resonance cannot be found on the next complete tuning attempt. A default value is loaded into RESCOPY initially in case resonance is never found.

The TOOHI and TOOLOW subroutines have optional lines of code that make it easy to determine whether the circuit is finding resonance or not. These optional lines of code will cause the transducer to vibrate, or the alarm tone to sound, at a very high or a very low frequency, depending on whether resonance has been missed on the high or low sides, respectively.

At the beginning of the MARKTIME subroutine are lines of code which reject frequency oscillation between adjacent alarm tones. The first time that MARKTIME is entered, the CALVAL value that controls the frequency of the alarm tone is checked to determine how it compares to the frequency of the previous alarm tone.

From the preceding description, it can be seen that both the method and electronic self-tuning circuit of the present invention provide for fast, accurate, and automated determination of resonance frequency and, thereby, maintenance of peak performance in a vibratory transducer.

Although the invention has been described with reference to the preferred embodiment illustrated in the attached drawings, it is noted that equivalents may be employed and substitutions made herein without departing from the scope of the invention as recited in the claims. Depending on the particular application and context, for example, it may be deemed preferable to compare voltages other than the leading and trailing edge voltages. It may also be preferable to deduce the distance and direction to resonance based upon the waveform's slope and the slope's rate of change. Furthermore, although described for purposes of illustration as being applied to the electroacoustic speaker of a common back-up alarm, the present invention has application to any vibratory transducers.

The following is computer program code for a preferred embodiment of the electronic self-tuning circuit of the present invention, as described above. This program code was written specifically for use with a PIC12C508 microcontroller, but is readily adaptable to other types of controllers and control systems.

```
list P=12C508
include <P12c508.inc>
N EQU 0xD0              ;Ns are used as LITERALS.
NN EQU 0x03             ;Ns control the # of periods in the square wave
I EQU 0x07              ;The number of square wave periods is N * NN.
II EQU 0x08             ;Is and Js are used as timing loop FILE REGISTERS.
III EQU 0x09
J EQU 0x0A              ;You can use the same FILE REGISTER for different...
                        ;code blocks.
R EQU 0xB6              ;Rs are used as LITERALS.
RR EQU 0xB5             ;Rs control the rest period between BEEPS.
RRR EQU 0x05
MB EQU 0x0B             ;FILE REGISTER controlling main body of the square
                        wave.
CALVAL EQU 0x0C         ;FILE REGISTER holding calibration value.
CVL EQU 0x6C;0x68       ;LITERAL placed in CALVAL to give starting pitch...
                        ;68 h-1285 Hz.
DEFAULT EQU 0x5D        ;LITERAL default value to give 1400 Hz.
COMPARE EQU 0x0D        ;FILE REGISTER storing comparator value.
RESCOPY EQU 0x0E        ;FILE REGISTER storing last resonance value.
FLAG EQU 0x0F           ;FILE REGISTER storing tuning & checking flags.
;PITCHREG EQU 0x10      ;FILE REGISTER counting the # of calls to PITCH.
CF EQU 0x12             ;LITERAL setting cap fill up time.
MINVALUE EQU 0x42       ;LITERAL for minimum calibration value.
MAXVALUE EQ 0x83        ;LITERAL for maximum calibration value.
FREETUNE EQU 0x11       ;FILE REGISTER allow # of wave cycles to tune freely
FREESTART EQU 0x05; 0x07          ;LITERAL allowing # of cycles of tune freely.
FREEAGAIN EQU 0x07; 0x07          ;LITERAL allowing free tuning cycles after failure.
OLDVAL EQU 0x12         ;FILE REGISTER holding last CALVAL to compare to...
                        ;present.
LASTMATCH EQU 0x13      ;FILE REGISTER holding the value of the last CALVAL...
                        ;match.
             ;TEST PROCEDURE
;FLAG6-1 GO TO MARKTIME           You can set flag6 after loading CALVAL with CVL
;FLAG7=1 FREETUNE OVER MINVALUE, MAXVLUE, to go straight to
MARKTIME &
;FLAG3=1 PITCHRAISE               find what are the pitches created. But 1st use
;FLAG4=1 PITCH LOWER              the simulator to make sure MARKTIME balances
                                  the
;FLAG2=1 2ND FAILURE              tuning section.
;FLAG1=1 FIRST BEEP IS OVER
;FLAG0=1BEEP OCSILATION COMPARISON IS OVER
START   ORG     0x00              ;Calibrating internal oscillator to 4 MHz.
    MOVWF OSCCAL
    MOVLW CVL
    MOVWF CALVAL                  ;Initializing CALVAL to give starting pitch.
    MOVLW DEFAULT
    MOVWF RESCOPY                 ;Copying DEFAULT for resonance back up.
    MOVLW 0x00                    ;Code here to clear TUNE & CHECK flags
                                  before...
                                  ;1st BEEP.
    MOVWF FLAG
BEEP        MOVLW FREESTART       ;Number of times alarm tunes freely.
        MOVWF FREETUNE
        MOVLW NN            ;Ns control the # of periods in the square wave.
        MOVWF II            ;The # of times pitch is called is simply N * NN.
LOOP_2 MOVLW N
        MOVWF I
LOOP_1 CALL PITCH           ;Each call to pitch generates one square wave period.
        DECFSZ I, 1
        GOTO LOOP_1
        DECFSZ II, 1
        GOTO LOOP_2         ;End of BEEP.
REST        MOVLW RRR       ;This REST after BEEP needs to be adjusted to be
                            shorter...
        MOVWF III           ;as the pitch gets lower, REST should be adjusted to be...
CIRC_3      MOVLW RR        ;longer as the pitch gets higher. It would be ideal to...
        MOVWF II        ;maintain 40% on and 60% off for all pitches.
CIRC_2      MOVLW R
        MOVWF I
CIRC_1      DECFSZ I, 1
        GOTO CIRC_1
        DECFSZ II, 1
        GOTO CIRC_2
```

-continued

```
        DECFSZ III, 1
        GOTO CIRC_3
COPY
        MOVLW 0x05; 0x05          ;This can cause pitch change for each BEEP.
        ADDWF CALVAL, F           ;Lowering pitch a bit to aid in res. stability.
        MOVLW 0x02; 0x02          ;Code here to clear TUNE&CHECK flags before...
        MOVWF FLAG                ;each BEEP and set first BEEP finished flag.
OMEGA   GOTO BEEP                 ;End of REST
;--------------------------------------------------------
PITCH               ;INCF PITCHREG, F ;counting the # of calls to PITCH.
        BTFSC FLAG,6    ;Checking if tuning is finished.
        GOTO MARKTIME
;Loop to balance the end part of MAKEWAVE.
;These next 4 lines hold the square wave low for a few cycles.
        MOVLW 0x07
        MOVWF J
LOWHOLD DECFSZ J, 1
        GOTO LOWHOLD
        NOP
          ;FB KILLED CAP FILLS      OUTPUT HIGH
        MOVLW    0xFC             ;gp1=out low, gp5, pg4, gp2=input, gp0=out high.
        TRIS GPIO                 ;FC=1111, 1100 Cap allowed to fill up.
        MOVLW    0x01             ;Setting gp1=out low, gp0=out high.
LASTDWN MOVWF GPIO                ;Setting the output data latches.
UP      CALL MAKEWAVE             ;SQARE WAVE HIGH, t=0.
          ;FEEDBACK ENABLED CAP DRAINS
        MOVLW    0xCE             ;gp1, gp2=input, gp0, gp4, gp5=out low.
        TRIS GPIO                 ;Cap drains & square wave low CE=1100, 1110
        MOVLW 0x00                ;gp0, gp4, gp5=out low.
LASTUP    MOVWF GPIO
DOWN      CALL ADJUST             ;SQUARE WAVE LOW, t=0.
PITCHEN   RETLW 0x00              ;End of PITCH subroutine. Back to Loop_1
;--------------------------------------------------------
;MAKEWAVE IS THE HIGH SECTION OF THE SQUARE WAVE
MAKEWAVE MOVLW CF                 ;Loop allowing cap 59us to fill up. The 1st time...
MOVWF J                           ;delay in ADJUST should exactly match the 1st...
                                  ;time delay in MAKEWAVE.
FILLCAP DECFSZ J, F
        GOTO FILLCAP              ;Cap voltage captured by gp4=out low
        MOVLW    0xEC             ;gp1, gp4=out low, gp5, gp2=input, gp0=out high.
gp4low    TRIS    GPIO            ;EC=1110, 1100 Vcap locked in.
MAINB1     MOVF CALVAL, W         ;Setting up MB loop controlled by calibration value.
        MOVWF MB                  ;MB=Main Body of the square wave.
ROUN_1 DECFSZ MB, F               ;Use 50% duty cycle. 42% duty cycle will greatly...
        GOTO ROUN_1               ;complicate the algorithm.
        NOP
        BTFSC FLAG, 7             ;0=FREETUNE, 1=FREETUNE finished.
        GOT0 HERE2
        DECFSZ FREETUNE, F        ;3 paths ;Flag not set 7 counts.
        GOTO HERE                 ;Flag just set for all paths.
        BSF FLAG, 7               ;Flag was set.
        GOTO HERE3
HERE2     NOP
        NOP
HERE    NOP
        NOP
HERE3     BCF     COMPAR, 0       ;Storing comparator output.
        ;;; NOP, If ;BCF (above) then simulator can go to LOWER for a timing test
        BTFSC GPIO, 2          ;Comparator output is read at edge of square wave.
        BSF COMPAR, 0          ;Comparator Hi/Low is now in file COMPAR
        RETLW 0x00             ;End of MAKEWAVE subroutine.
;--------------------------------------------------------
;ADJUST IS THE LOW SECTION OF THE SQUARE WAVE.
;Calibration value is adjusted according to COMPAR value.
;COMPAR=0 DEC CALVAL          COMPAR=1 INC CALVAL
ADJUST BTFSC COMPAR, 0            ;PATHS
                                  ;FREETUNE; FLAGSET; DONEUP; DONDOWN
        GOTO LOWER                ;TOOHIGH; TOOLOW; TRYAGAIN
RAISE NOP                     ;to balance RAISE and LOWER because of ADJUST
                              jump.
        ;;;;;NOP
        ;;;;;NOP                ;RAISE AND LOWER.(you may not need these, let...
                              ;emulator decide).
        BTFSS FLAG, 7          ;0=FREETUNE, 1=FLAGSET(set flags)
        GOTO TRIM
                              ;FREETUNE/FLAGSET & MARKTIME paths must...
                              ;match in instruction cycles.
BSF FLAG, 3                   ;Null this line & one below &alarm will tune indefinitely.
        BTFSC FLAG, 4          ;Setting RAISE flag to compare to LOWER flag.
```

-continued

```
        GOTO DONEUP           ;If both flags set, then done tuning.
        GOTO TRIM1
TRIM        NOP
        NOP                   ;These NOPS balance the FREETUNE/FLAGSET paths.
        NOP
        NOP
TRIM1       DECF CALVAL, F
        MOVLW MINVALUE        ;Minimum allowable calibration value.
        SUBWF CALVAL, W       ;Subtracting MINVALUE from CALVAL.
        BTFSS STATUS, C    ;Carry bit=1 if CALVAL not too small.(result pos/zero).
        GOTO TOOHI         ;If CALVAL is too small, try again or load default.
        GOTO RESTE1
;--------------------------------------------------------
LOWER       BTFSS FLAG, 7     ;0=FREETUNE, 1=FLAGSET(set flags)
        GOTO INCR
                              ;FREETUNE/FLAGSET & MARKTIME paths
                              must...
                              ;match in instruction cycles.
        BSF FLAG, 4           ;remove this line & one above & alarm will tune...
                              ;indefinitely.
        BTFSC FLAG, 3
        GOTO DONDOWN
        GOTO INCR1
INCR        NOP
        NOP                ;These NOPS balance the FREETUNE/FLAGSET paths.
        NOP
        NOP
INCR1       INCF CALVAL, F
        MOVLW MAXVALUE        ;Maximum allowable calibration value.
        SUBWF CALVAL, W       ;Subtracting MAXVALUE from CALVAL.
        BTFSC STATUS, C       ;Carry bit=0 if CALVAL is not too big.(result neg).
        GOTO TOOLOW           ;If CALVAL is too big, try again or loaddefault.
        GOTO RESTE1
TOOLOW      BTFSS FLAG, 2     ;Checking if the failure occurred before.
        GOTO TRYAGAIN         ;Clearing flags and loading low limit to find
                              resonance.
                              ;MOVLW MAXVALUE; DEFAULT
TOOLOW & TOOHI are to find which way the BEEP failed.
;MOVWF CALVAL
;LOW TONE FAIL, production code will have average resonance value.
;Null either the two lines of code above or the two lines of code below.
;Null the two lines above for production code.
;Null the two lines below for easy failure detection.
        MOVF RESCOPY, W       ;Copying RESCOPY into CALVAL (last
                              resonance).
        MOVWF CALVAL          ;If resonance not found then use last found...
                              ;resonance.
        NOP
        BSF FLAG, 6           ;Setting flag 6 high.
        GOTO RESTE1
;--------------------------------------------------------
TOOHI       BTFSS FLAG, 2     ;Checking if this failure occurred before...
        GOTO TRYAGAIN         ;clearing flags and loading low limit to find
                              resonance.
        ;MOVLW MINVALUE       ;Loading highest pitch for easy failure detection.
        ;MOVWF CALVAL         ;High tone fail, not for production code.
;Null either the two lines of code above or the two lines of code below.
;Null the two lines above for production code.
;Null the two lines below for easy failure detection.
        MOVF RESCOPY, W       ;Copying RESCOPY into CALVAL (last
                              resonance).
        MOVWF CALVAL          ;If resonance not found then will use last found...
                              ;resonance.
        NOP
        BSF FLAG, 6           ;Setting flag 6 high.
        GOTO RESTE1
TRY AGAIN MOVLW 0x04       ;0000,0100 SET FLAG 2 AND CLEAR ALL OTHERS.
        MOVWF FLAG            ;Attempting to find resonance after 1 failed
                              attempt.
        MOVLW FREEAGAIN       ;Number of times alarm tunes freely.
        MOVWF FREETUNE        ;Allowing tuning w/o flags set for as few cycles.
        MOVLW MAXVALUE;
        MOVWF CALVAL
        GOTO RESTE1
;DONETUNE; MOVLW 0xFF
        ;MOVWF FLAG           ;Setting flags 3, 4 and 6 high.
        ;MOVLW 0x04           ;Lowering pitch a bit to aid in resonance stability.
        ;ADDWF CALVAL, F      ;Can alter CALVAL here because once flag 6 is...
                              ;set this code is not used again until next BEEP.
```

-continued

```
DONEUP DECF CALVAL, F
        MOVF CALVAL, W          ;Copying CALVAL to RESCOPY (last resonance).
        MOVWF RESCOPY           ;If resonance not found, then use last found...
                                ;resonance.
        NOP
        BSF FLAG, 6             ;Setting flag 6 high.
        GOTO RESTE2
DONDOWN INCF CALVAL, F
        MOVF CALVAL, W          ;Copying CALVAL to RESCOPY (last resonance).
        MOVWF RESCOPY           ;If resonance not found, then use last found...
                                ;resonance.
        NOP
        BSF FLAG, 6             ;Setting flag 6 high.
        NOP
        NOP                     ;These NOPs balance the
                                DONEUP/DONDOWN...
        RESTE2 NOP              ;paths with the FREETUNE/FLAGSET paths.
        NOP
        NOP
RESTE1  MOVLW 0x06              ;This loop is to balance the 1st part of
                                MAKEWAVE.
        MOVWF J                 ;It should use as much time as before the MB
                                loop...
                                ;in MAKEWAVE.
DELAY1 DECFSZ J, F
        GOTO DELAY1
        ;NOP                    ;These NOPs are to balance the waveform.
        ;NOP;
MAINB2      MOVF CALVAL, W      ;Setting up MB loop controlled by calibration value.
MOVWF MB
ROUN_2 DECFSZ MB, F
        GOTO ROUN_2
        RETLW 0x00              ;End of ADJUST subroutine. Back to PITCHEN.
;-------------------------------------------------------
MARKTIME
;The next 11 lines of code reject pitch oscilation between adjacent beeps.
        BTFSC FLAG, 0           ;Allowing only one CALVAL comparison per beep.
        GOTO SKIPTEST           ;Test made upon 1st entry into MARKTIME.
        MOVF CALVAL, W
        BTFSS FLAG, 1           ;Testing if 1st beep has ocurred.
        MOVWF OLDVAL            ;If this is 1st beep make OLDVAL=CALVAL.
        SUBWF OLDVAL, F         ;Comparing present & lastbeep CALVALs.
        BTFSS STATUS, Z         ;Z bit=1 if CALVALs are the same.
        GOTO NOMATCH            ;If not the same then use LASTMATCH to drive
                                pitch.
        MOVWF LASTMATCH         ;If CALVALs are the same then update
                                LASTMATCH.
        NOMATCH MOVWF OLDVAL        ;The present beep becomes the lastbeep.
        BSF FLAG, 0             ;Set so test is skipped for the remainder of the
                                beep.
;Place here loop to balance the end part of MAKEWAVE.
;These next 4 lines hold the square wave low for a few cycles.
SKIPTEST MOVLW 0x06             ;The above lines of code are actuated once per
                                beep.
        MOVWF J                 ;Thus, don't consider them in balancing the wave.
TOWHOLD DECFSZ J, 1
        GOTO TOWHOLD
        MOVLW 0xFE              ;1111, 1110 all inputs except GP0. FB enabled.
        TRIS GPIO
        MOVLW      0x01         ;Setting gp1=out low, gp0=out high.
LSTDWN MOVWF GPIO               ;Setting the output data latches.
UYP         CALL MKEWAVE        ;SQUARE WAVE HIGH, t=0.
            ;FEEDBACK ENABLED CAP DRAINS
        ;NOP                    ;gp1, gp2=input, gp0, gp4, gp5=out low.
        ;NOP                    ;Cap drains & square wave low CE=1100, 1110.
        MOVLW 0x00              ;gp0=out low.
LSTUYP MOVWF GPIO
DWN         CALL ADJST          ;SQUARE WAVE LOW, t=0.
PTCHEN GOTO PITCHEN             ;End of PITCH subroutine.
;-------------------------------------------------------
;MKEWAVE IS THE HIGH SECTION OF THE SQUARE WAVE
MKEWAVE MOVLW 0x16              ;Loop allowing cap 59us to fill up. The 1st time...
        MOVWF J                 ;delay in ADJUST should exactly match the first...
                                ;time delay in MAKEWAVE.
FLLCAP DECFSZ J, F
        GOTO FLLCAP             ;Cap voltage caputed by gp4=out low
        ;NOP                    ;gp1, gp4=out low, gp5, gp2=input, gp0=out high.
gp4lw       ;NOP                ;EC=1110, 1100 Vcap locked in.
        ;MOVLW 0x04
```

-continued

```
        ;ADDWF CALVAL, F
MANB1 MOVFLAST MATCH, W          ;Setting up MB loop controlled by calibration
value.
        MOVEWF MB                ;MB=Main Body of the square wave.
RON_1 DECFSZ MB, F               ;Use 50% duty cycle. 42% duty cycle will greatly...
        GOTO RON_1               ;complicate the algorithm.
        NOP                      ;Storing comparator output.
        NOP                      ;Comparator output is read at edge of square
                                 wave.
        NOP                      ;Comparator Hi/Low is now in file COMPAR
        RETLW 0x00               ;End of MKEWAVE subroutine.
;------------------------------------------------------
;ADJST IS THE LOW SECTION OF THE SQUARE WAVE.
;Calibration value is adjusted according to COMPAR value.
;COMPAR=0 DEC CALVAL     COMPAR=1 INC CALVAL
ADJST
RASE ;NOP                             ;To balance RAISE and LOWER.
        NOP                           ;Setting RAISE flag to compare LOWER
                                      flag.
        NOP                           ;If both flags set, then done tuning.
        GOTO DNETUNE;
DNETUNE
        NOP                           Setting flags 3, 4, and 6 high.
        NOP                           ;Balance to maintain 50% duty cycle
                                      during...; TUNING & DONETUNE.
        RSTE        MOVLW 0x04        ;This loop is to balance the 1st part of...
                                      ;MAKEWAVE. It should usse as much time
        MOVWF J                       ;as before the MB loop in MAKEWAVE.
DLAY        DECFSZ J, F
        GOTO DLAY
        NOP                           ;These NOPs are to balance the waveform.
        NOP;
MANB2           MOVF LASTMATCH, W     ;Setting up MB loop controlled by
                                      calibration...;value.
            MOVWF MB
RON_2 DECFSZ MB, F
            GOTO RON_2
;Place here loop to balance the end part of MAKEWAVE.
;These next 4 lines hold the square wave low for a few cycles.
            MOVLW 0x04
            MOVWF J
LOHOLD DECFSZ J, 1
            GOTO LOHOLD
            RETLW 0x00               ;End of ADJUST subroutine.
;------------------------------------------------------
        END
```

Having thus described the preferred embodiment of the invention, what is claimed as new and desired to be protected by Letters Patent includes the following:

1. An electronic self-tuning circuit physically coupled to a vibratory transducer, vibratory transducer having a resonance frequency and operable to produce a waveform having rising and falling edges, the electronic self-tuning circuit being operable to determine the resonance frequency, the electronic self-tuning circuit comprising:

a connector for connecting with a power supply operable to provide a voltage which intermittently may undesirably increase or decrease in magnitude;

negative feedback circuitry operable to prevent the vibratory transducer from increasing in loudness as the power supply voltage increases;

transducer connection circuitry operable to provide a physical connection between the electronic self-tuning circuit and the vibratory transducer;

comparator circuitry operable to compare the rising and falling edges of the waveform and to assign a value indicative of the results of the comparison; and controller circuitry operable to produce a signal having a frequency and further operable to adjust the frequency in response to the value assigned by the comparator circuitry.

2. The electronic self-tuning circuit of claim 1, further comprising voltage regulation circuitry operable to protect against undesirable increases or decreases in the voltage provided by the power supply.

3. The electronic self-tuning circuit of claim 1, further comprising connection protection circuitry operable to protect against and prevent reverse current flow through the electronic self-tuning circuit.

4. The electronic self-tuning circuit of claim 1, further comprising amplification circuitry operable to amplify the waveform.

5. An electronic self-tuning circuit physically coupled to an electroacoustic speaker, the electroacoustic speaker having a resonance frequency and being operable to convert electrical energy to acoustic energy and to produce a waveform having rising and falling edges, the electronic self-tuning circuit being operable to determine the resonance frequency, the electronic self-tuning circuit comprising:

a connector for connecting with a power supply operable to provide a voltage which intermittently may undesirably increase or decrease in magnitude;

negative feedback circuitry operable to prevent the electroacoustic speaker from increasing in loudness as the power supply voltage increases;

transducer connection circuitry operable to provide a physical connection between the electronic self-tuning circuit and the electroacoustic speaker;

comparator circuitry operable to compare the rising with and falling edges of the waveform and to assign a value indicative of the results of the comparison; and controller circuitry operable to produce a test signal having a test frequency and further, operable to adjust the test frequency in response to the value assigned by the comparator circuitry.

6. The electronic self-tuning circuit of claim 5, further comprising voltage regulation circuitry operable to protect against undesirable increases or decreases in the voltage provided by the power supply.

7. The electronic self-tuning circuit of claim 5, further comprising connection protection circuitry operable to protect against and prevent reverse current flow through the electronic self-tuning circuit.

8. The electronic self-tuning circuit of claim 5, further comprising amplification circuitry operable to amplify the waveform.

9. An electronic self-tuning circuit physically coupled with a vibratory transducer, the vibratory transducer having a resonance frequency and being operable to produce a waveform having a rising edge and a falling edge in response to a test signal, the electronic self-tuning circuit being operable to determine approximately the resonance frequency of the vibratory transducer, the electronic self-tuning circuit comprising:

comparator circuitry operable to compare the rising edge with the falling edge of the waveform and to produce a result indicative thereof; and control circuitry operable to produce the test signal, wherein the test signal has a frequency, and to adjust the frequency in response to the result of the comparison, wherein the frequency of the test signal is lowered if the result of the comparison indicates that the rising edge is higher than the falling edge, and the frequency of the test signal is raised if the result of the comparison indicates that the rising edge is lower than the falling edge.

10. An electronic self-tuning circuit physically coupled with a vibratory transducer, the vibratory transducer having a resonance frequency and being operable to produce a waveform having a rising edge and a falling edge in response to a test signal, the electronic self-tuning circuit being operable to determine approximately the resonance frequency of the vibratory transducer, the electronic self-tuning circuit comprising:

a connector for connecting with a power supply operable to provide a voltage for powering the electronic self-tuning circuit;

voltage regulation circuitry operable to protect against an intermittent change in the voltage;

comparator circuitry operable to compare the rising edge with the falling edge of the waveform and to produce a result indicative thereof; and control circuitry operable to produce the test signal, wherein the test signal has a frequency, and to adjust the frequency in response to the result of the comparison, wherein the frequency of the test signal is lowered if the result of the comparison indicates that the rising edge is higher than the falling edge, and the frequency of the test signal is raised if the result of the comparison indicates that the rising edge is lower than the falling edge.

11. An electronic self-tuning circuit physically coupled with a vibratory transducer, the vibratory transducer having a resonance frequency and being operable to produce a waveform having a rising edge and a falling edge in response to a test signal, the electronic self-tuning circuit being operable to determine approximately the resonance frequency of the vibratory transducer, the electronic self-tuning circuit comprising:

a connector for connecting with a power supply operable to provide a voltage for powering the electronic self-tuning circuit;

negative feedback circuitry operable to substantially prevent the vibratory transducer from changing in loudness due to a change in the voltage;

comparator circuitry operable to compare the rising edge with the falling edge of the waveform and to produce a result indicative thereof; and control circuitry operable to produce the test signal, wherein the test signal has a frequency, and to adjust the frequency in response to the result of the comparison, wherein the frequency of the test signal is lowered if the result of the comparison indicates that the rising edge is higher than the falling edge, and the frequency of the test signal is raised if the result of the comparison indicates that the rising edge is lower than the falling edge.

12. An electronic self-tuning circuit physically coupled with a vibratory transducer, the vibratory transducer having a resonance frequency and being operable to produce a waveform having a rising edge and a falling edge in response to a test signal, the electronic self-tuning circuit being operable to determine approximately the resonance frequency of the vibratory transducer, the electronic self-tuning circuit comprising:

transducer connection circuitry operable to provide a physical connection between the electronic self-tuning circuit and the vibratory transducer;

connection protection circuitry operable to protect against reverse current flow due to improper coupling of the electronic self-tuning circuit with the transducer via the transducer connection circuitry;

comparator circuitry operable to compare the rising edge with the falling edge of the waveform and to produce a result indicative thereof; and control circuitry operable to produce the test signal, wherein the test signal has a frequency, and to adjust the frequency in response to the result of the comparison, wherein the frequency of the test signal is lowered if the result of the comparison indicates that the rising edge is higher than the falling edge, and the frequency of the test signal is raised if the result of the comparison indicates that the rising edge is lower than the falling edge.

13. The electronic self-tuning circuit as set forth in claim 12, wherein the transducer connection circuitry includes a first transducer connection circuitry for connecting a first type of vibratory transducer having a first performance rating, and a second transducer connection circuitry for connecting a second type of vibratory transducer having a second performance rating.

14. The electronic self-tuning circuit as set forth in claim 13, wherein the first performance rating and the second performance rating are defined by decibel output and power rating of the vibratory transducer.

* * * * *